US008095840B2

(12) United States Patent
Swoboda

(10) Patent No.: US 8,095,840 B2
(45) Date of Patent: Jan. 10, 2012

(54) SERIAL SCAN CHAIN IN A STAR CONFIGURATION

(75) Inventor: Gary L. Swoboda, Sugarland, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/098,747

(22) Filed: May 2, 2011

(65) Prior Publication Data
US 2011/0209015 A1    Aug. 25, 2011

Related U.S. Application Data

(62) Division of application No. 12/134,759, filed on Jun. 6, 2008, now Pat. No. 7,958,419.

(60) Provisional application No. 60/933,649, filed on Jun. 7, 2007.

(51) Int. Cl.
*G01R 31/28* (2006.01)

(52) U.S. Cl. .................................. 714/727; 714/726
(58) Field of Classification Search ............ 714/726, 714/729, 30, 724, 727
See application file for complete search history.

(56) References Cited

U.S. PATENT DOCUMENTS
7,962,814 B2 *   6/2011   Swoboda .................... 714/727
* cited by examiner

*Primary Examiner* — Phung M Chung
(74) *Attorney, Agent, or Firm* — Lawrence J. Bassuk; W. James Brady; Frederick J. Telecky, Jr.

(57) ABSTRACT

A method implemented to test a plurality of components coupled in a star configuration, each component having a test access port (TAP) controller. The method comprises performing a capture phase of a scan operation on all of the TAP controllers in the star configuration and sequentially selecting one of the TAP controllers at a time to perform a shift state. When all of the TAP controllers have been sequentially selected to perform the shift phase, the method further comprises selecting all of the TAP controllers to perform an update phase.

4 Claims, 3 Drawing Sheets

US 8,095,840 B2

SERIAL SCAN CHAIN IN A STAR CONFIGURATION

RELATED APPLICATIONS

This application is a divisional of application Ser. No. 12/134,759, filed Jun. 6, 2008, currently pending; Which claims priority to and incorporates by reference U.S. Provisional Patent Application No. 60/933,649, filed Jun. 7, 2007, entitled "Tracking Participants In A Multi-Drop Communications Scheme Where Multiple Parties Parts May Be Active At Once," which is incorporated herein by reference in its entirety.

BACKGROUND

As electronic circuits and devices have become more complex, testing of these devices has become increasingly difficult. Test standards have been developed to address at least some of these testing difficulties. One such standard, written by the Joint Test Action Group ("JTAG"), is IEEE standard number 1149.1, which describes the Standard Test Access Port and Boundary-Scan Architecture. Boundary scan is a methodology that allows controllability and observability of the boundary pins in a JTAG-compatible device via software control. This capability allows testing of circuit boards that otherwise might not be practical or possible given the trace pitch and multi-layering of printed circuit boards today.

Typically, JTAG-compatible devices (e.g., chips, circuit boards) are connected in series in a scan chain. However, it may be desirable to connect such devices in a parallel (star) configuration for testing purposes. Performing JTAG testing on devices in a star configuration is problematic in the JTAG standard.

SUMMARY

In accordance with one embodiment, a method is implemented to test a plurality of components coupled in a star configuration, each component having a test access port (TAP) controller. The method comprises performing a capture phase of a scan operation on all of the TAP controllers in the star configuration and sequentially selecting one of the TAP controllers at a time to perform a shift state. When all of the TAP controllers have been sequentially selected to perform the shift phase, the method further comprises selecting all of the TAP controllers to perform an update phase.

In accordance with another embodiment, a system comprises a debug test system (DTS) and a plurality of target systems (TS) coupled to the DTS via a test communication link in a star configuration. Each TS has a test access port (TAP) controller coupled to the test communication link. The DTS causes all of the TAP controllers to concurrently perform a capture state in which all of the TAP controllers acquire new data and also to transition to a pause state. The DTS sequentially selects one TAP controller at a time to shift data out of the selected TAP controller while the other TAP controllers remain in the pause state.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
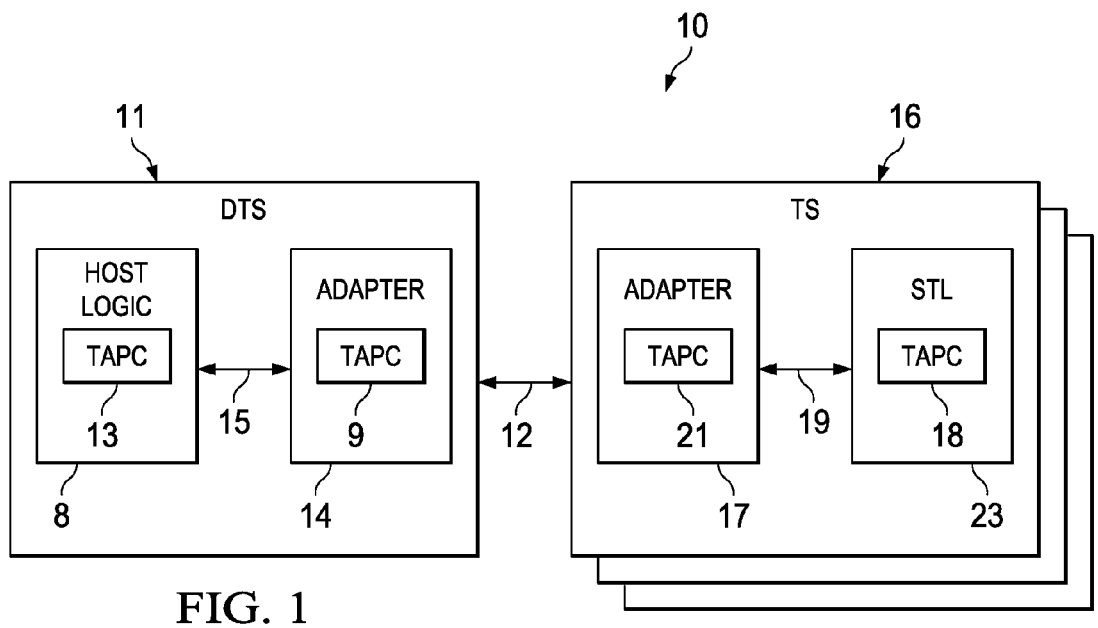
FIG. 1 shows a system in accordance with various embodiments.

FIG. 1 illustrates a system 10 in accordance with various embodiments. The system 10 comprises a debug and test system (DTS) 11 that is coupled to one or more target systems (TS) 16. The DTS 11 provides for testing of the DTS's 11. In some embodiments, the DTS 11 and TS's 16 are JTAG-compliant (Joint Test Action Group) and are coupled via a JTAG communication link 12.

The DTS 11 comprises a JTAG adapter 14 coupled to host logic 8 containing a test access port (TAP) controller 13 (TAPC) via an IEEE 1149.1 bus 15. Similarly, each TS 16 comprises a JTAG adapter 17 coupled to scan test logic (STL) containing a TAP controller (TAPC) 18 via an IEEE 1149.1 bus 19. DTS 11 is capable of sending test and debug sequences via link 12 to any or all of the TS's 16. The sequences allow DTS 11 to configure the TS's 16 for a test, execute the test, and read back the results of the test. The DTS 11 may be configured to couple to the TS's 16 using a four or five wire implementation of link 12 as defined under the JTAG architecture. The link 12 includes signals TCK (clock), TMSC (mode select), TDI (data in), TDO (data out), and optionally RTCK (return clock). At least the TCK, TMSC, TDI and TDO signals are used when the DTS 11 communicates with the TS's 16 according to the JTAG protocol. This architecture is further described in U.S. Pat. Pub. 20060279439, incorporated herein by reference.

Figure 2:
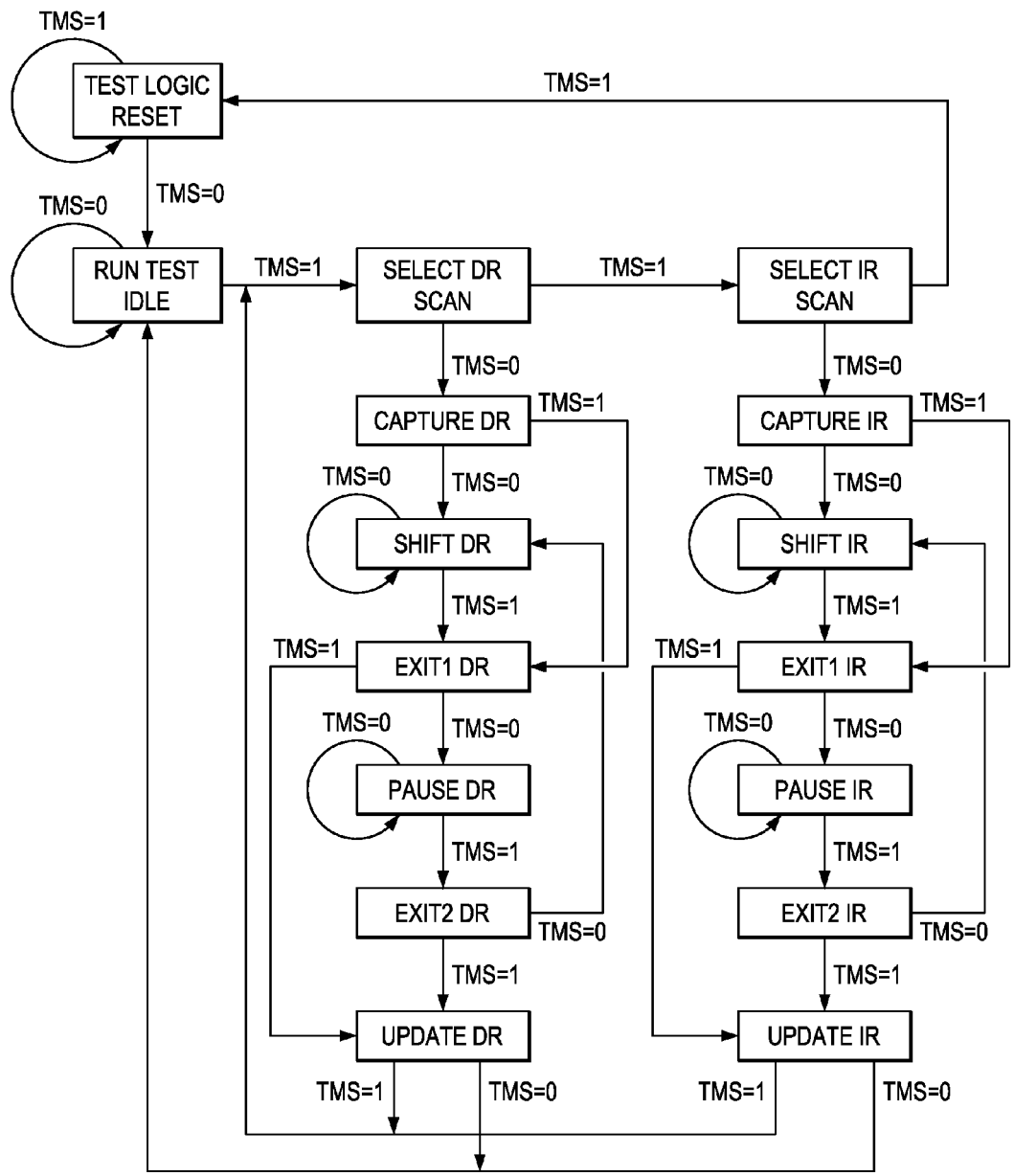
FIG. 2 shows a state diagram usable in conjunction with the system of FIG. 1.

FIG. 2 shows a state diagram in accordance with the JTAG standard. From the test logic reset state, a TAP controller may enter the run test idle state depending on the TMS bit. From run test idle, the TAP controller may perform a data register (DR) scan or an instruction register (IR) scan. Each of the DR and IR scans generally involves the TAP controller performing a capture, shift, and update as illustrated. Various pause or exit states are built into the state diagram. Following the update, the TAP controller may return to the run test idle state or perform another DR or IR scan.

Figure 3:
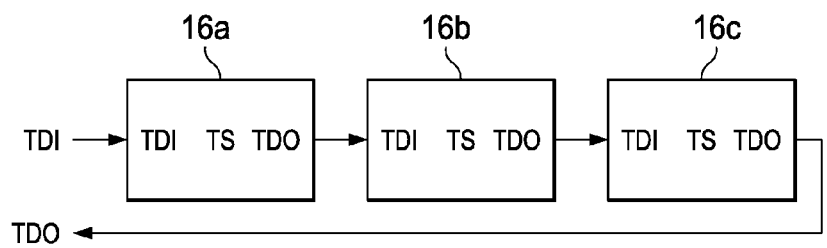
FIG. 3 illustrates a series scan configuration.

JTAG-enabled systems have generally been configured in a series scan configuration during testing as illustrated in FIG. 3. FIG. 3 illustrates three target systems (TS 16a-16c). All three TS's are coupled in series. The TDI signal from the DTS 11 is provided to TS 16a and the TDO output of TS 16a is connected to the TDI input of TS 16b. The TDO output of TS 16b is connected to the TDI input of TS 16c. The TDO output of TS 16c provides the test output signal back to the DTS 11. In a series scan configuration as in FIG. 3, all of the TAP controllers of the TS's 11 transition together through the state diagram of FIG. 2. That is, all of the TAP controllers of the TS's perform a capture, shift and update concurrently. All of the TAP controllers shift their data in unison with the output of one TAP controller being shifted to the input of the next TAP controller in series.

Figure 4:
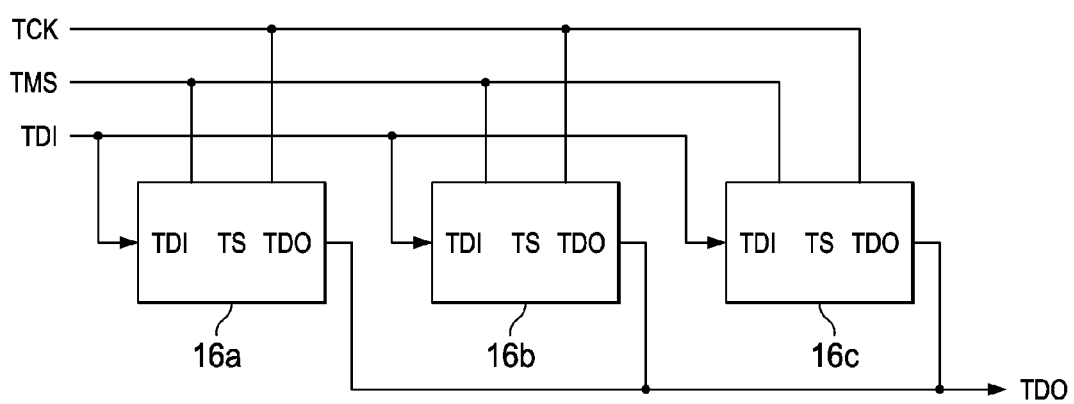
FIG. 4 illustrates a star scan configuration in accordance with various embodiments.

FIG. 4 illustrates a star configuration in which the three TS's 16a-16c share the JTAG signals TCK, TMS, TDI and TDO. In a star configuration, all of the TAP controllers of the TS's can perform capture and update scans together, but not shifts. The reason that shifts cannot be performed in unison is that all of the TS's would attempt to drive different bits onto the same, common TDO signal line thereby creating a drive conflict on TDO. The embodiments disclosed herein solve this problem by implementing a series equivalent of the scan operation on a star configuration.

The operations performed by the Capture-xR and Update-xR TAP states (the "x" refers to either "D" for data or "I" for instruction) for a series scan topology (FIG. 3) are duplicated in a star scan topology (FIG. 4), with the number of clock periods between the Update-xR and Capture-xR TAP states remaining the same. However, the scan operation exchanging data with the TAPs of interest between the Capture-xR and Update-xR TAP states altered. The scan operation used with a series scan topology is synthesized using a series of scan operations with a star scan topology, each operation in the series targeting a single and different TAP controller of interest. A description of this process follows.

In a star scan topology the TAP controllers of interest (TAP controllers to be scanned) are called the "Scan Group" while the TAP controllers that are not of interest (TAP controllers not to be scanned) are called the "Idle Group." The TAP state of the Idle Group is parked in the Run-Test/Idle state while the Scan Group participates in DR and IR Scans. A series equivalent scan is performed with the Scan Group as follows.

Figure 5:
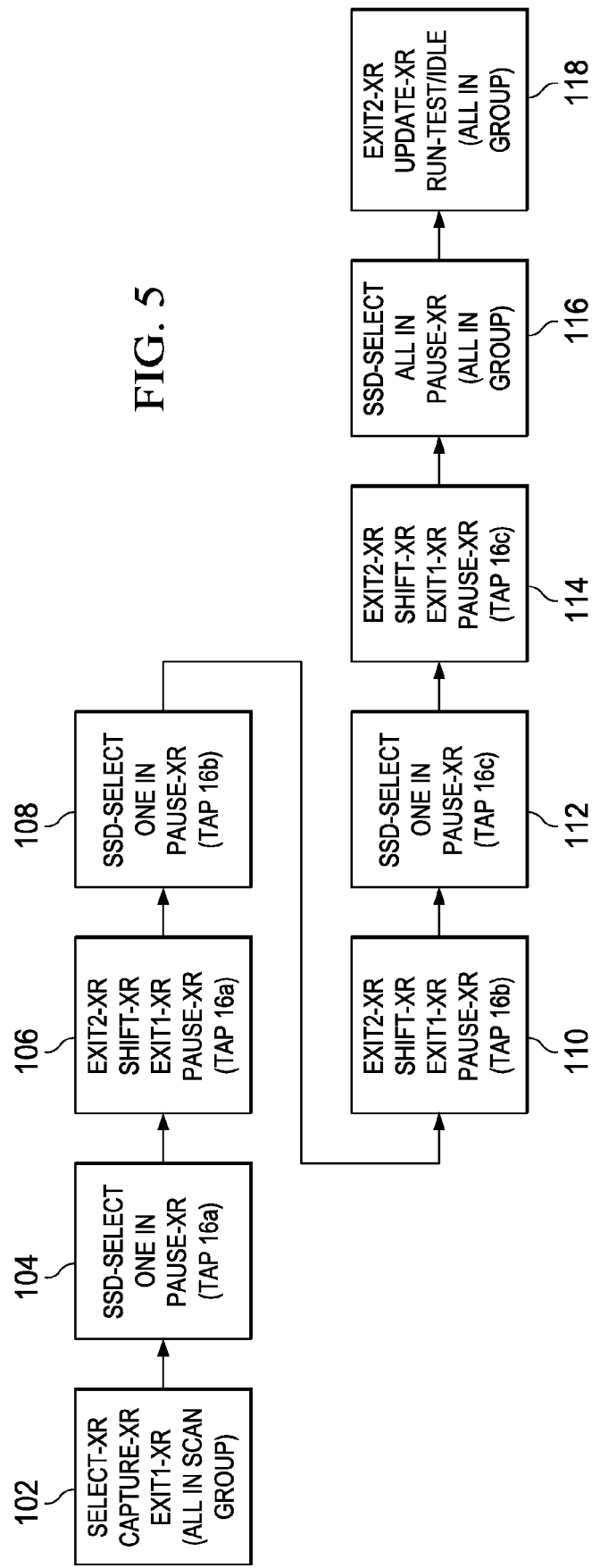
FIG. 5 shows a preferred embodiment of a method in which a series scan is synthesized on a star scan configuration.

Referring to FIGS. 2 and 5, the TAP state of the Scan Group moves through the Capture-xR and Update-xR TAPC states 102 and 118 in lock-step. That is, in those states, all members of the Scan Group perform captures and updates in unison. Between the two states 102 and 118, the shift portion of a scan is divided into sections with each section dedicated to selecting and scanning only one member of the Scan Group while the TAP state of the other members of the Scan Group are parked in the Pause-xR state.

At 102, all members of the Scan Group perform a capture which entails moving through the Select-xR, Capture-xR and Exit1-xR states, without traversing the Shift-xR TAP controller state.

At 104, all members of the Scan Group transition to the Pause-xR state. While in the Pause-xR state, a Scan Selection Directive (SSD) is performed. Various SSDs are possible and are encoded bits on the TDI inputs to each TS 16. One of the SSDs is a "select one" TAP controller in which one of the TAP controllers is selected using an address unique to the target TAP controller. Another SSD is a "select all" SSD in which all members of the Scan Group are selected. At 104, a "select one" SSD is performed to select one member of the Scan Group (e.g., the TAP controller of TS 16a). With the TAP controller of TS 16a selected and the other TAP controllers not selected (decoupled), a shift is performed at 106 on the one selected TAP controller. The shift is performed by moving the selected TAP controller through the Exit2-xR state, the Shift-xR state, the Exit1-xR state and finally back to the Pause-xR state.

At this point, all members of the Scan Group are in the Pause-xR state. Another one of the TAP controllers (e.g., the TAP controller of TS 16b) is selected at 108 using the "select one" SSD message encoded with the target TAP controller's address. The selected TAP controller then performs a shift at 110 by moving through the Exit2-xR, Shift-xR, Exit1-xR and Pause-xR states. At 112 and 114, yet another member of the Scan Group (e.g., the TAP controller of TS 16c) is selected using the "select one" SSD and then shifted as described above.

Once all members of the Scan Group have been individual selected and shifted, at 116, a "select all" SSD is issued to select all members of the Scan Group while in the Pause-xR state. At 118 (and all members of the Scan Group have been selected and coupled), the Update phase of the scan is performed by moving the Scan Group through the Exit2-xR and Update-xR states and, if desired, back to the Run-Test/Idle state.

The "select one" SSD uses a value that is unique to the targeted TAP controller. That value can be a TAP Controller Address (TCA) or a Controller Identifier (CID). A TCA preferably is a 35-bit value comprising a 27-it IDCODE concatenated with an 8-it node identification number (NODE ID). Per the IEEE 1149 specification, the 27-bit IDCODE comprises a 16-bit part number and an 11-bit manufacturer identifier. The 8-bit NODE ID provides for 256 uniquely addressable TAP controllers with identical IDCODE elements. The NODE ID is created at the chip level using any one of several methods or a mix of the following methods: from external pins whose value is latched when chip hard reset is released, fusible elements, programmable elements such as electrically-erasable programmable read-only memories (EEPROMs), a register loaded by the application, and fixed (hardwired). The TCA is generated and provided to the associated TAP controller.

In alternative embodiments, since TCAs are 35 bits in length and at least some systems will have 16 or fewer TAP controllers, a performance improvement can be attained by allocating a four-bit alias for up to 16 TCAs. This alias is called a Controller ID (CID). Any of a variety of techniques is possible to allocate CIDs to each TAP controller.

The SSDs described above can use either the TCA or CID values to select a particular TAP controller. SSDs are encoded with a 3-bit directive to specify the type of SSD. A directive bit pattern of "010" means that the SSD is a "select one" SSD using a CID. The CID value is part of the SSD's payload. A directive bit pattern of "110" means that the SSD is a "select one" SSD using a TCA, which is part of the SSD's payload. A directive bit pattern of "111" means that the SSD is the "select all" SSD. A directive bit pattern of "000" means that the SSD is a "clear all" SSD (all members of the Scan Group are decoupled).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A process of testing target systems connected in a star configuration, each target system having a test access port controller, comprising:
    A. moving all of the TAP controllers from a RunTest/Idle state, through a Capture-DR state and an Exit1-DR state into a Pause-DR state without traversing a Shift-DR state;
    B. selecting one of the TAP controllers with encoded bits on a TDI input to each target system;
    C. moving only the selected TAP controller through an Exit2-DR state, a Shift-DR state, the Exit1-DR state, and back to the Pause-DR state; and
    D. de-selecting the one TAP controller and selecting another one of the TAP controllers with encoded bits on a TDI input to each target system;
    E. moving only the other selected TAP controller through an Exit2-DR state, a Shift-DR state, the Exit1-DR state, and back to the Pause-DR state; and
    F. selecting all of the TAP controllers with encoded bits on a TDI input to each target system and moving all of the TAP controllers from the Pause-DR state to an Update-DR state.

2. The process of claim 1 in which selecting one of the TAP controllers includes generating a controller address unique to the TAP controller.

3. The process of claim 1 in which selecting one of the TAP controllers includes providing a controller address to all of the TAP controllers, the controller address being valid for only one of the TAP controllers receiving the address.

4. The process of claim 1 including assigning a unique address or identifier to each TAP controller from which each TAP controller is then selected.

* * * * *